(12) United States Patent
Hill et al.

(10) Patent No.: US 10,401,228 B2
(45) Date of Patent: Sep. 3, 2019

(54) SIMULTANEOUS CAPTURING OF OVERLAY SIGNALS FROM MULTIPLE TARGETS

(71) Applicant: KLA-Tencor Corporation, Milpitas, CA (US)

(72) Inventors: Andrew V. Hill, Portland, OR (US); Amnon Manassen, Haifa (IL); Yuri Paskover, Caesarea (IL); Yuval Lubashevsky, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/052,044

(22) Filed: Aug. 1, 2018

(65) Prior Publication Data

US 2018/0335346 A1 Nov. 22, 2018

Related U.S. Application Data

(63) Continuation of application No. 15/222,503, filed on Jul. 28, 2016, now Pat. No. 10,048,132.

(51) Int. Cl.
*G01J 4/04* (2006.01)
*G01B 11/27* (2006.01)
*G03F 7/20* (2006.01)

(52) U.S. Cl.
CPC .............. *G01J 4/04* (2013.01); *G01B 11/272* (2013.01); *G03F 7/70633* (2013.01)

(58) Field of Classification Search
CPC ....... G01J 4/04; G01B 11/272; G03F 7/70633

USPC .......................................................... 356/364
See application file for complete search history.

(56) References Cited

U.S. PATENT DOCUMENTS

| | | | | |
|---|---|---|---|---|
| 4,749,278 A * | 6/1988 | van der Werf | ........ | G03F 9/7049 356/401 |
| 8,692,994 B2 * | 4/2014 | Straaijer | ............ | G03F 7/70625 356/369 |
| 8,896,832 B2 * | 11/2014 | Hill | ...................... | G01N 21/474 356/364 |
| 9,784,987 B2 * | 10/2017 | Hill | ...................... | G03F 7/70625 |
| 2004/0207849 A1 * | 10/2004 | Nikoonahad | ....... | G03F 7/70633 356/401 |
| 2007/0296973 A1 * | 12/2007 | Kiers | ..................... | G01N 21/21 356/369 |
| 2008/0198380 A1 * | 8/2008 | Straaijer | ............ | G01B 11/0641 356/369 |
| 2009/0154318 A1 * | 6/2009 | Noehte | .................. | G02B 21/08 369/53.35 |
| 2009/0168062 A1 * | 7/2009 | Straaijer | ............. | G03F 7/70566 356/364 |
| 2011/0069312 A1 * | 3/2011 | Kandel | ................ | G01N 21/956 356/369 |

(Continued)

*Primary Examiner* — Roy M Punnoose
(74) *Attorney, Agent, or Firm* — Hodgson Russ LLP

(57) ABSTRACT

Metrology methods and systems are provided, in which the detected image is split at a field plane of the collection path of the metrology system's optical system into at least two pupil plane images. Optical elements such as prisms may be used to split the field plane images, and multiple targets or target cells may be measured simultaneously by spatially splitting the field plane and/or the illumination sources and/or by using two polarization types. The simultaneous capturing of multiple targets or target cells increases the throughput of the disclosed metrology systems.

23 Claims, 16 Drawing Sheets

(56) References Cited

U.S. PATENT DOCUMENTS

2014/0146322 A1* 5/2014 Hill ................... G03F 7/70625
                                                                356/446

* cited by examiner

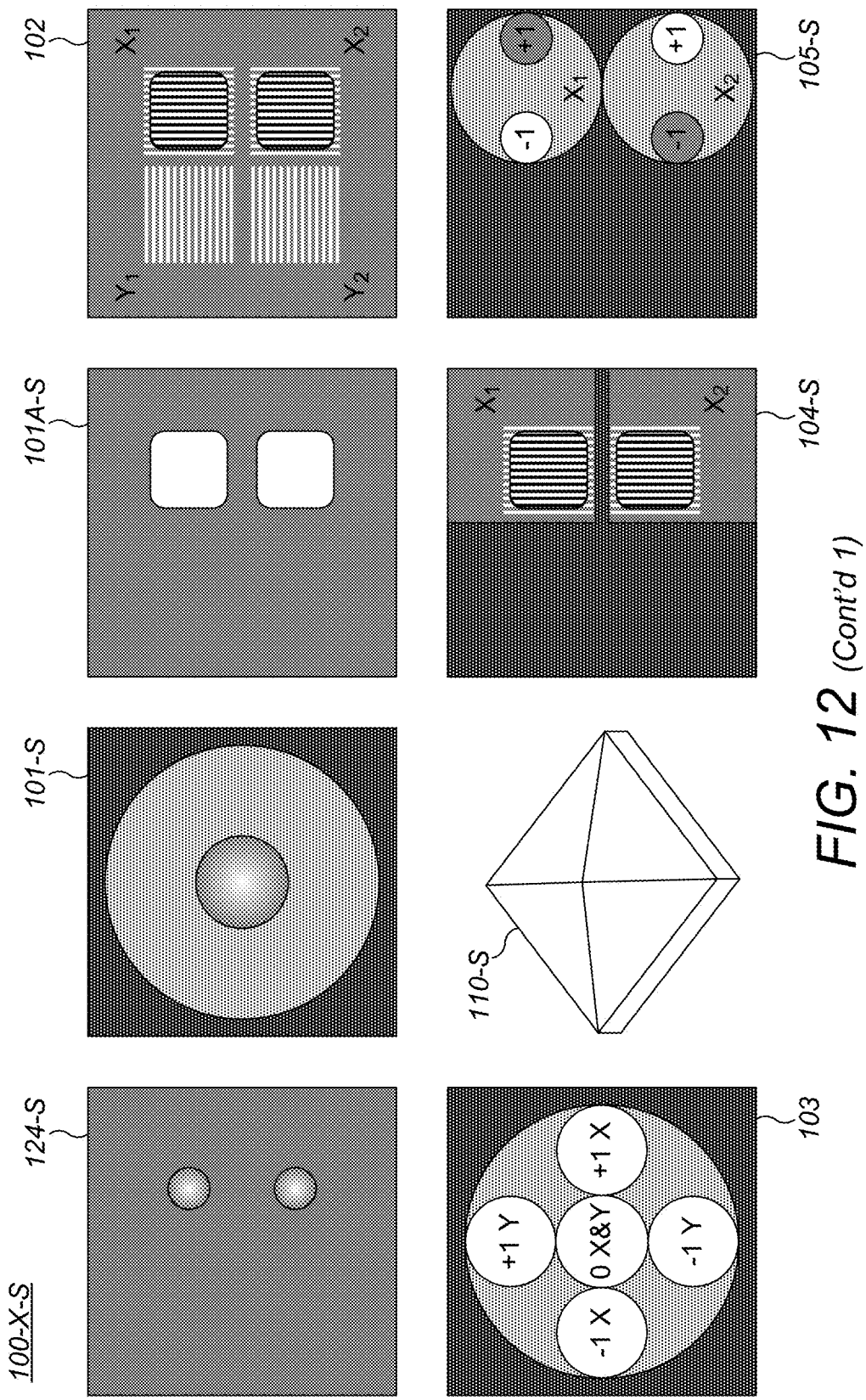
FIG. 12 (Cont'd 1)

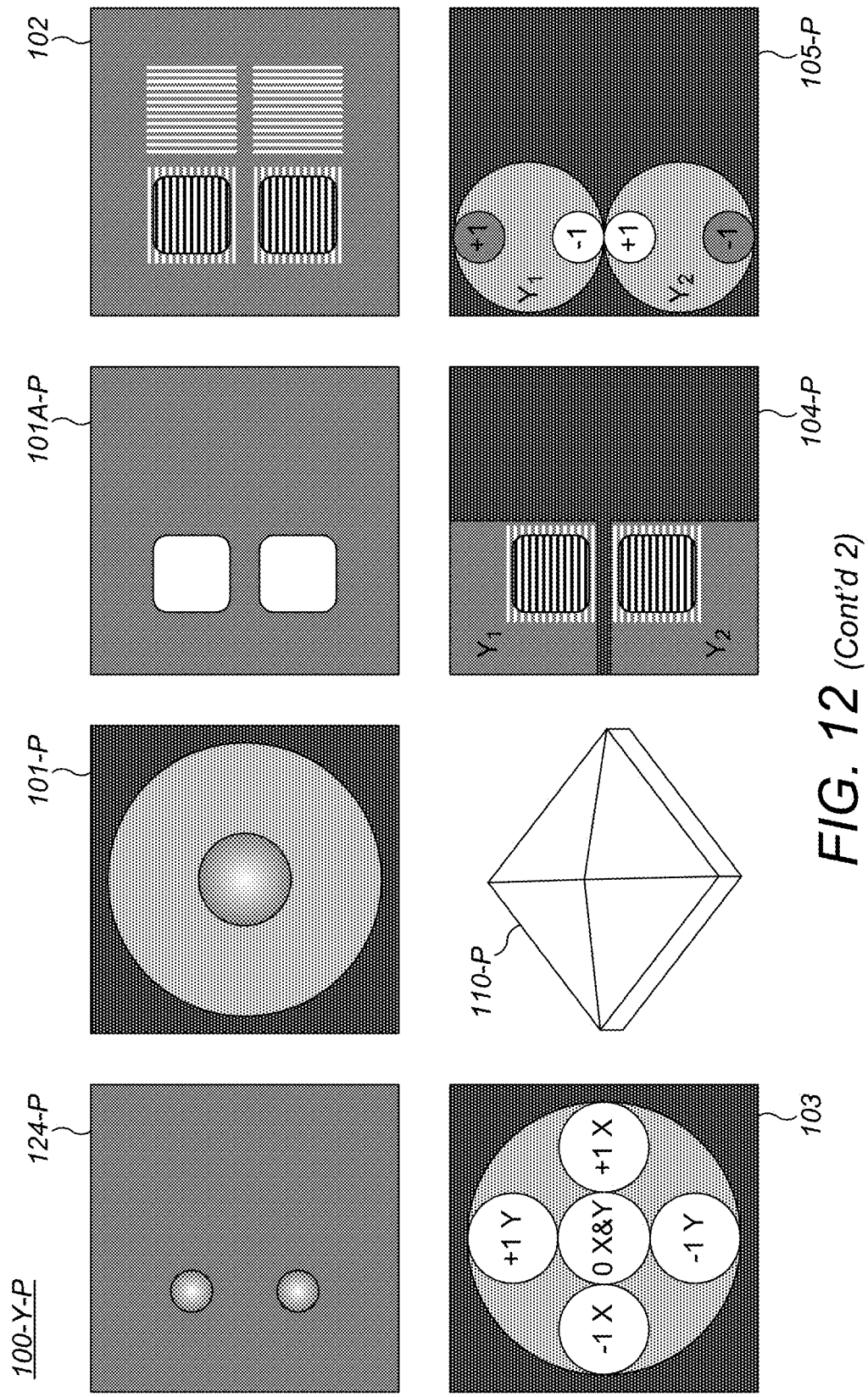
FIG. 12 (Cont'd 2)

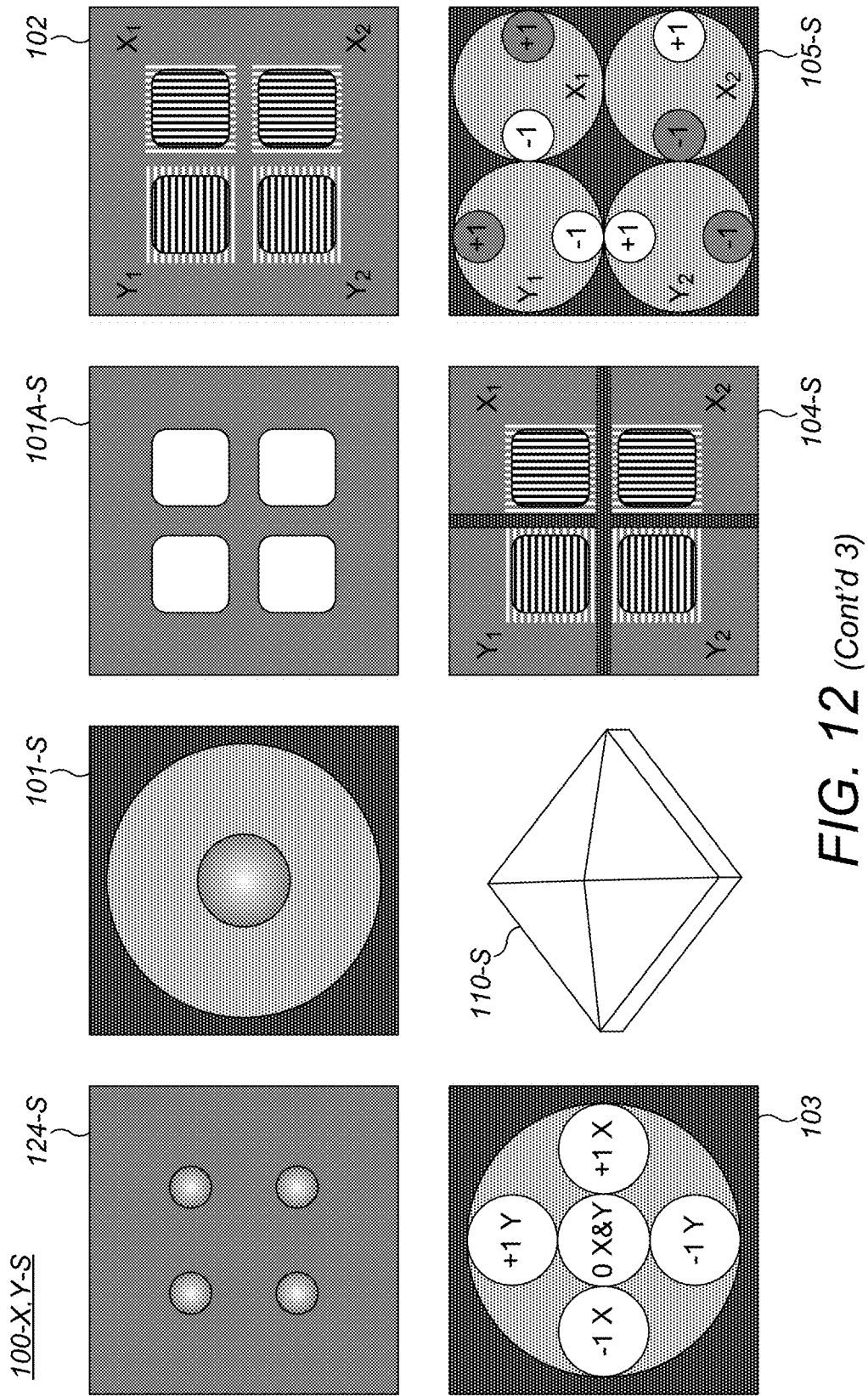
FIG. 12 (Cont'd 3)

SIMULTANEOUS CAPTURING OF OVERLAY SIGNALS FROM MULTIPLE TARGETS

CROSS REFERENCE TO RELATED APPLICATIONS

This application is a continuation of U.S. patent application Ser. No. 15/222,503 filed on Jul. 28, 2016, which is incorporated herein by reference in its entirety.

BACKGROUND OF THE INVENTION

1. Technical Field

The present invention relates to the field of scatterometry overlay metrology, and more particularly, to pupil plane optical metrology system.

2. Discussion of Related Art

Scatterometry overlay (SCOL) metrology performs overlay measurements on grating over grating targets, having each grating printed on a different process layer and typically comprising two X-targets and two Y-targets (X and Y referring to perpendicular measurement directions), each with equal and opposite programmed overlay offsets. The overlay targets are measured by an optical system having an illumination path and a collection path, the former typically employing illumination from a narrow spectral range with sub-aperture fill of the illumination pupil and latter directing light diffracted by grating targets to detector(s). Overlay measurements are extracted by comparing relative intensities of opposing diffraction orders (e.g., +1 and −1 first order diffraction signals) from each target. FIGS. 1-3 are schematic illustrations of prior art metrology optical systems used for measuring scatterometry overlay signals.

FIG. 1 schematically illustrates a pupil imaging system 70 which comprises an illumination path 61 with an illumination source 62 and a collection path 69 with a detector 66. A beam splitter 65 directs the illumination onto a target 63 and directs the reflected signals through an objective 64 to collection path 69. The optical planes in pupil imaging system 70 are illustrated as pupil and field planes, 71 and 72 respectively, of illumination path 61 and field and pupil planes, 75 and 76 respectively, of collection path 69, defined with respect to target 63 at field plane 73 and an objective pupil 74 (shown schematically). The adjacent images illustrate the typical images at illumination pupil 71 (with small NA illumination), illumination field stop 72 (or spot scan coverage), illuminated target 73, collected pupil 74 (zeroth and ±1 first diffraction orders), collection field stop 75 and collected pupil 76 on array sensor (detector) 66. Pupil imaging system 70 typically employs illumination of a single target with a scanned coherent spot (71, 73), simultaneous collection of +1 and −1 diffraction orders on a single array sensor positioned at a pupil plane (76), and sequential illumination of additional targets with synchronized capture of the collection pupil—resulting in slow sequential capture of signals from four different targets and requiring to move the wafer between measurements.

FIG. 2 schematically illustrates a field imaging system 80 which comprises illumination path 61 with illumination source 62 and collection path 69 with detector 66. Beam splitter 65 directs the illumination onto target 63 and directs the reflected signals through objective 64 to collection path 69. The optical planes in field imaging system 80 are illustrated as pupil planes 81A, 81B (for consecutive illuminations) of illumination path 61 and pupil and field planes, 84 and 85A, 85B (for consecutive images) respectively, of collection path 69, defined with respect to target 63 at field plane 82 and an objective pupil 83 (shown schematically). The adjacent images illustrate the typical images at illumination pupil 81A (with small NA illumination), illuminated target 82, collected pupil 83 (zeroth, −1 and −2 diffraction orders), aperture stop at relay collection pupil 84 and target image 85A on array sensor (detector) 66. In subsequent illumination 81B, subsequent target image 85B on array sensor (detector) 66 is produced. Field imaging system 80 typically employs illumination of one or more targets from a single oblique angle or illumination of the same target(s) at opposing obliquity angles (81A, 81B), collection of one first order diffraction from the target(s) (or single opposite orders in case of opposed illumination (85A, 85B) while blocking of all other diffraction orders including the zeroth order reflection (84), and isolation of single diffraction orders from each target on a field plane array sensor. As results, in field imaging systems 80 the sequential capture of diffraction from four different illumination AOI (angle of incidence) is slow; the collection NA is small (typically up to 0.40 NA) to block zeroth and higher diffraction orders—increasing thereby the size of the collection PSF and inducing contamination between neighboring targets and from objects in the periphery; the range of viable wavelengths that can be used for a specific target pitch is limited due to restrictions imposed on illumination AOI and collection AOI; the ability to mask out problematic areas within individual diffraction orders is precluded by the lack of angular resolution within the first order diffraction; and the illumination overfill of targets prevents using simultaneous illumination of different targets with different polarizations. In this configuration, the spatial extent of the illumination on each target cell must extend beyond the boundaries of each cell. In order for illumination to have different polarization states on different target cells, there must be sufficient space between cells, so that illumination intended for one cell does not contaminate the signal from a neighboring cell. The subsequent large spacing between cells and difficulty of introducing spatially controlled polarization makes this practically impossible.

FIG. 3 schematically illustrates a field imaging system 90 with pupil division, which comprises illumination path 61 with illumination source 62 and collection path 69 with detector 66. Beam splitter 65 directs the illumination onto target 63 and directs the reflected signals through objective 64 to collection path 69. Field imaging system 90 includes a prism 67 at a pupil plane 94 of collection path 69 which splits the pupil image to yield four field images on detector 66. The optical planes in field imaging system 90 are illustrated as pupil plane 91 of illumination path 61 and pupil and field planes, 94 and 95 respectively, of collection path 69, defined with respect to target 63 at field plane 92 and an objective pupil 93 (shown schematically). The adjacent images illustrate the typical images at illumination pupil 91, illuminated targets 92, collected pupil 93 (zeroth and one of first diffraction orders), the pupil image segmented by prism 67 at relayed pupil plane 94 and target images 95 on array sensor (detector) 66, each of the four target images being from a different pupil quadrant (due to prism shape). Field imaging system 90 with pupil division requires illumination of target(s) from two opposing pupil quadrants, at 45° relative to target gratings and requires a selection of wavelengths and grating pitches for which the first order X and Y diffraction signals fall within the other two opposing quadrants of collection pupil. Field imaging system 90 with pupil division isolates and separates light in the four pupil quadrants by the prism and forms four field images on a common sensor, each image being composed of light from one quadrant of the collected pupil. The overlay measurements for each target are extracted from the differences in intensity of that target in the quadrants formed by first order diffraction. These principles of operation results in a large PSF that induces contamination between neighboring targets and from objects in the periphery, as each target image is formed by a single collection pupil quadrant (at ca. 0.45 NA). Moreover, the illumination in one pupil quadrant and collection in another quadrant restricts the combination of wavelength and target pitch, the lack of angular resolution within the first order diffraction precludes the ability to mask out problematic area within individual diffraction orders and the illumination overfill of targets makes simultaneous illumination of different targets with different polarizations practically impossible.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a metrology system comprising an optical system with an illumination path and a collection path, with at least one detector at a pupil plane of the collection path, wherein the optical system comprises at least one optical element at at least one field plane of the collection path thereof which is configured to split a detected image into at least two pupil plane images.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
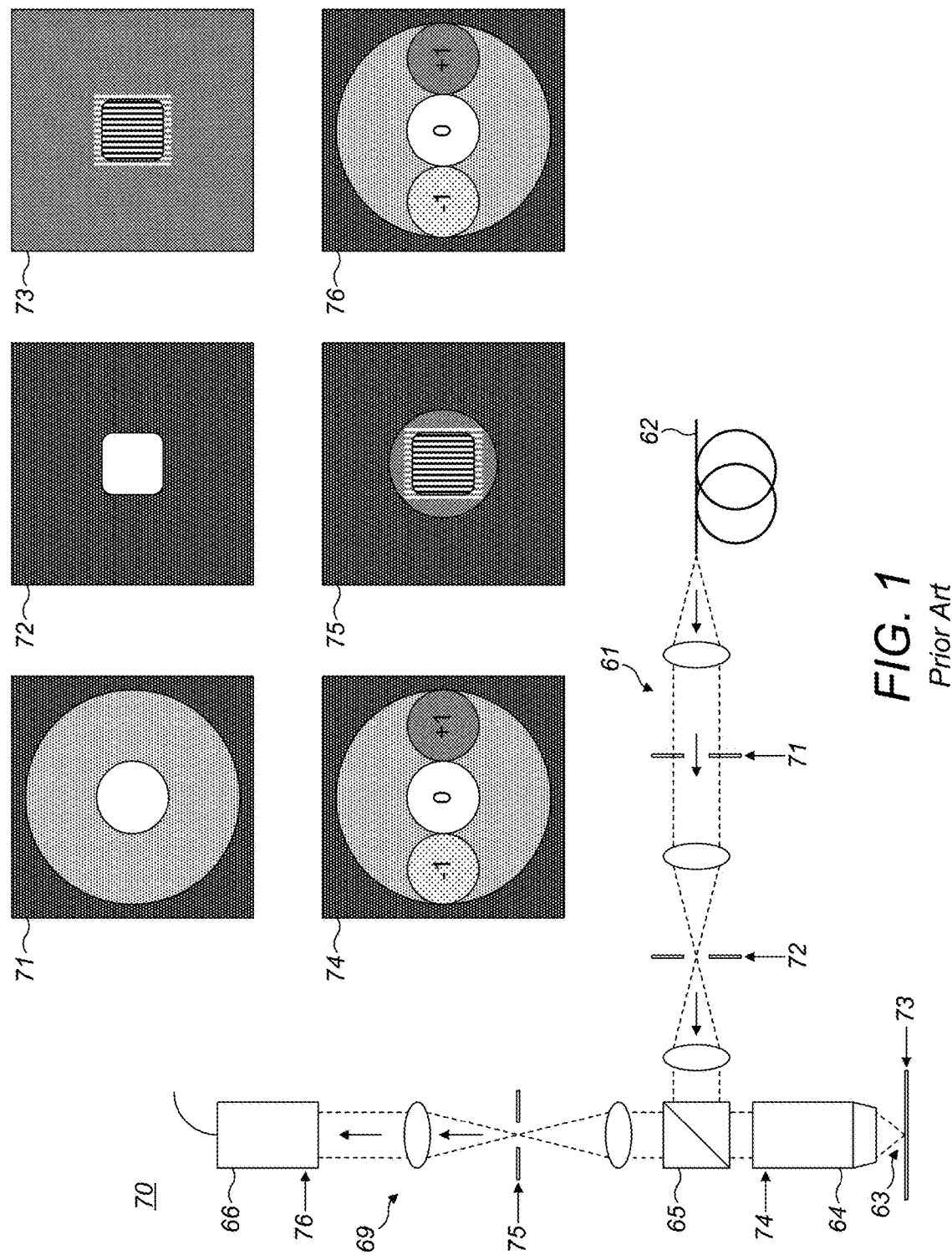
FIGS. 1-3 are schematic illustrations of prior art metrology optical systems used for measuring scatterometry overlay signals.
Figure 2:
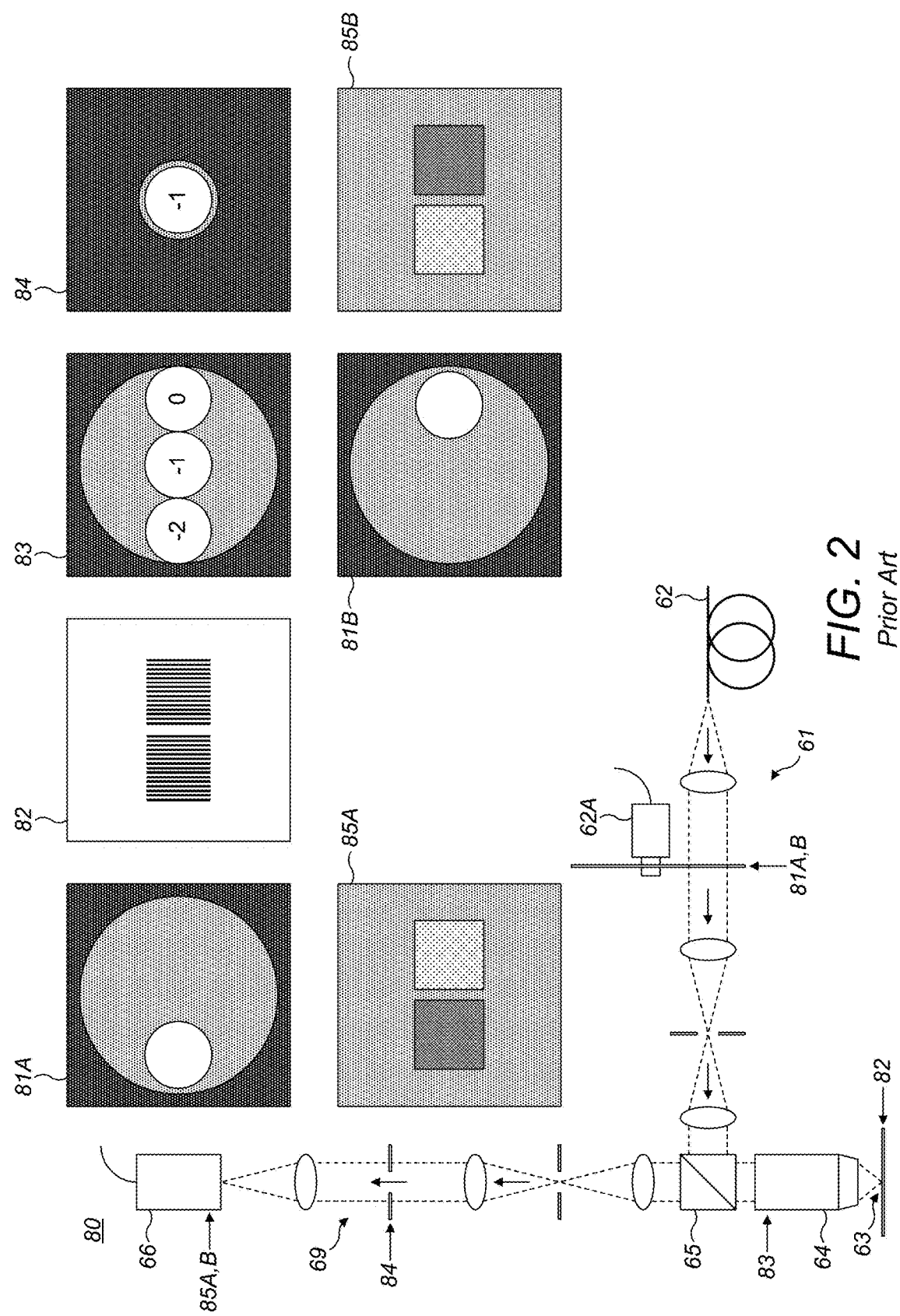
Figure 3:
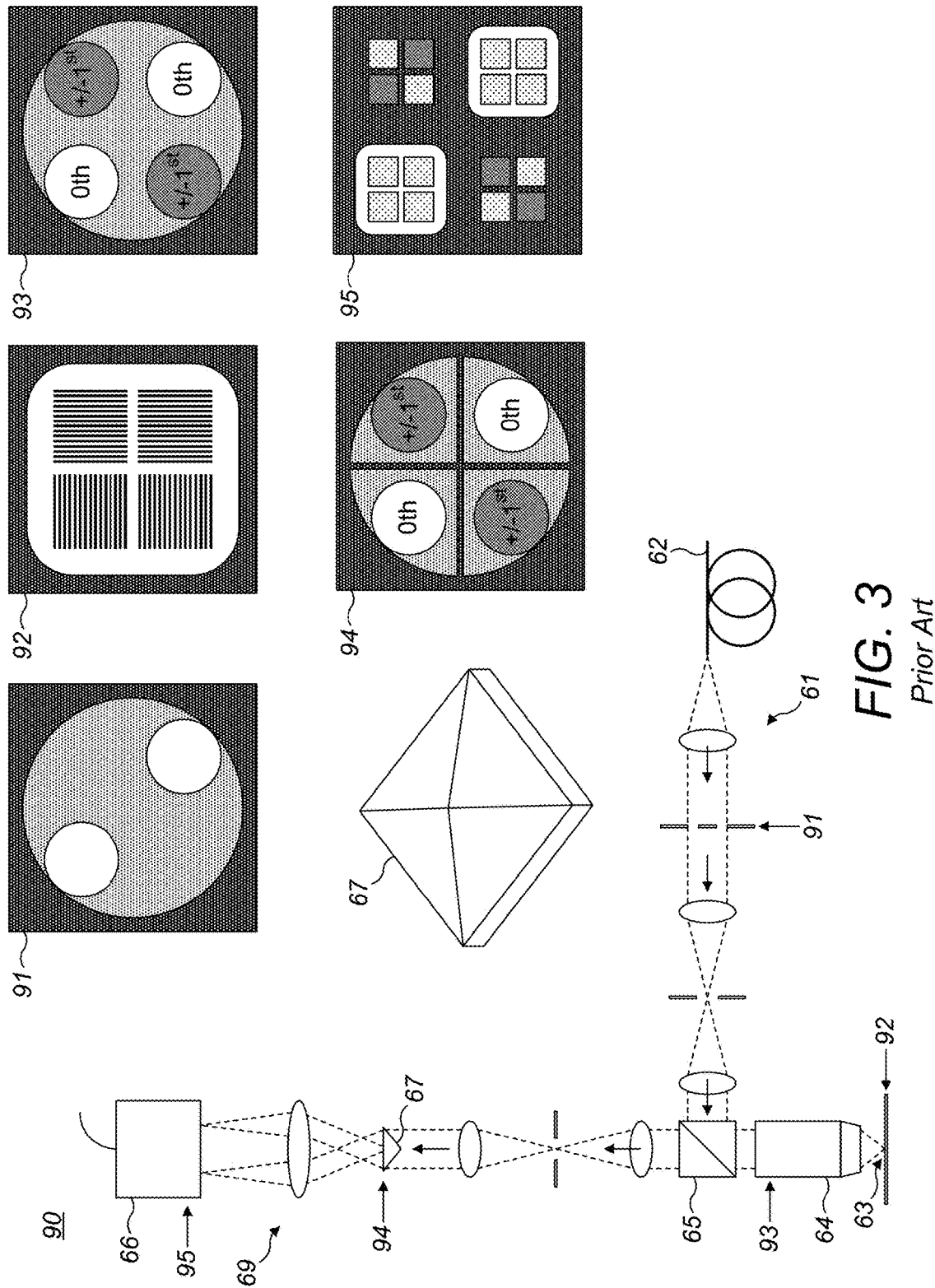

Prior to the detailed description being set forth, it may be helpful to set forth definitions of certain terms that will be used hereinafter.

The term "target" as used in this application refers to a periodic structure, typically but not limited to, a target cell with one periodic structure (e.g., a grating) over periodic structure (e.g., a grating). The terms target and target cell are used interchangeably and disclosed systems and methods are applicable to either, depending on implementation details.

The terms "illumination path" and "collection path" as used in this application refer to the non-overlapping parts of an optical system before and after target, respectively.

The term "field plane" as used in this application refers to any optical plane which is optically conjugate to the target in the optical system, including e.g., the optical plane in which the target image is formed. The term "pupil plane" as used in this application refers to any optical plane which is equivalent to the Fourier plane with respect to the target in the optical image, in particular at the pupil plane in the collection path, also termed relayed pupil plane, each point corresponds to a specific angle of diffracted light from the target.

The term "polarization" as used in this application refers to electromagnetic radiation with electromagnetic fields oscillating at a specified direction, which may be with respect to a plane (linear polarization), to a helix (circular polarization) or any other defined direction. The terms "S-polarization" and "P-polarization" as used in this application refer to any two distinguishable modes of polarization, such as different (e.g., orthogonal) linear polarizations, a linear polarization and a circular polarization and so forth. In particular, the prefixes "S" and "P" are merely used to designate different polarization modes and are not restricted to defining linear polarization modes with respect to beam splitter axes. Moreover, the polarization modes may be modified during operation.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Metrology methods and systems are provided, in which the detected image is split at a field plane of the collection path of the metrology system's optical system into at least two pupil plane images. Optical elements may be used to split the field plane images, and multiple targets or target cells may be measured simultaneously by spatially splitting the field plane and/or the illumination sources and/or by using two polarization types. The simultaneous capturing of multiple targets or target cells increases the throughput of the disclosed metrology systems.

Embodiments of the present invention provide efficient and economical systems, methods and mechanisms for simultaneous measurement of multiple overlay targets with angular resolution within the diffraction orders, high-NA (numerical aperture) formation of each target image (to minimize contamination) and greater spectral tuning flexibility. Disclosed systems and methods provide simultaneous SCOL target overlay measurements; simultaneous illumination of two or more grating-over-grating overlay targets by multiple illumination beams for efficient illumination; isolation and separation of the light from the different targets at a collection field plane; formation of pupil images from each target on separate array sensors or spatially separated on a common array sensor (providing angular resolution within each diffraction order); and enable capture of relative diffraction efficiencies from multiple targets simultaneously.

Additionally, disclosed systems and methods enhance measurement efficiency by isolating of illumination to the interiors of targets to minimize contamination between targets and from objects in periphery; providing controllable by-target illumination polarization, possibly separating signals from different targets by collection polarization prior to isolation by field positions; and enabling programmable illumination and collection field stops for sequential measurement of more than four targets within a single field of view without requiring stage motion between measurements.

Advantageously, disclosed systems and methods also allow adjustment of illumination AOI (angle of incidence) to enable a range of wavelengths for a given target grating pitch; allow collection of high-NA (typically 0.93 NA or higher) to minimize the size of the collection PSF (point spread function) and thereby minimize the contamination between neighboring targets and the contamination from objects in the periphery; provides angular resolution in pupil images for application of angular weighting masks and removal of problematic features in the pupil; and using illumination underfill of targets and enable by-target control of illumination polarization. In particular, by spatially underfilling the illumination of a target cell, the polarization and wavelength of the illumination can more easily be made different for different target cells without risk of inter-cell signal contamination.

These and other aspects of the invention are illustrated, in a non-limiting manner, in FIG. 4-13, elements from which may be combined in any operable combination. The illustration of certain elements in certain figures and not in others merely serves an explanatory purpose and is non-limiting. The metrology systems and optical systems may be used to generate and measure overlays between periodic structures at different target layers.

Figure 4:
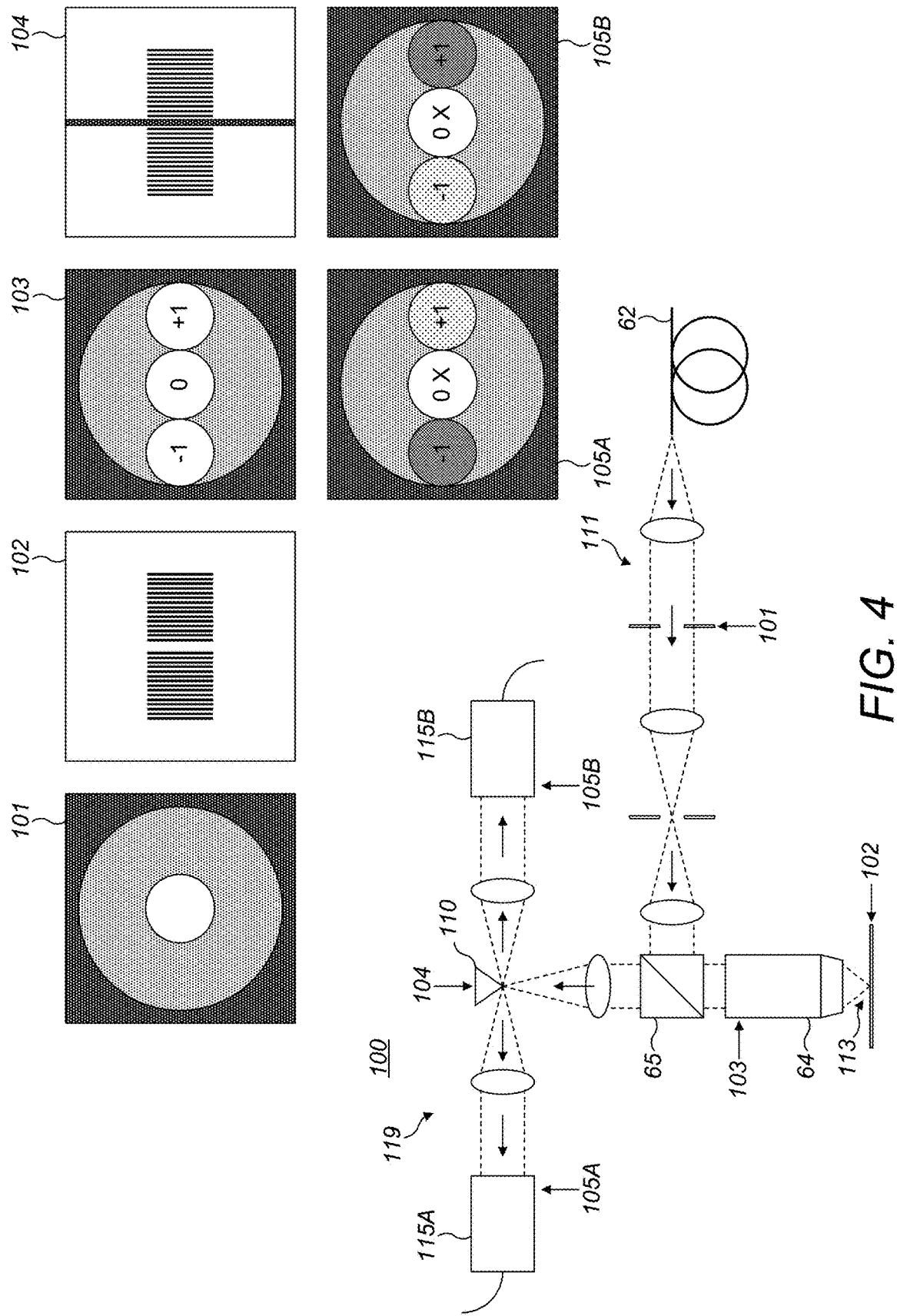
FIGS. 4 and 5 are high level schematic illustrations of pupil imaging optical systems, according to some embodiments of the invention.
Figure 5:
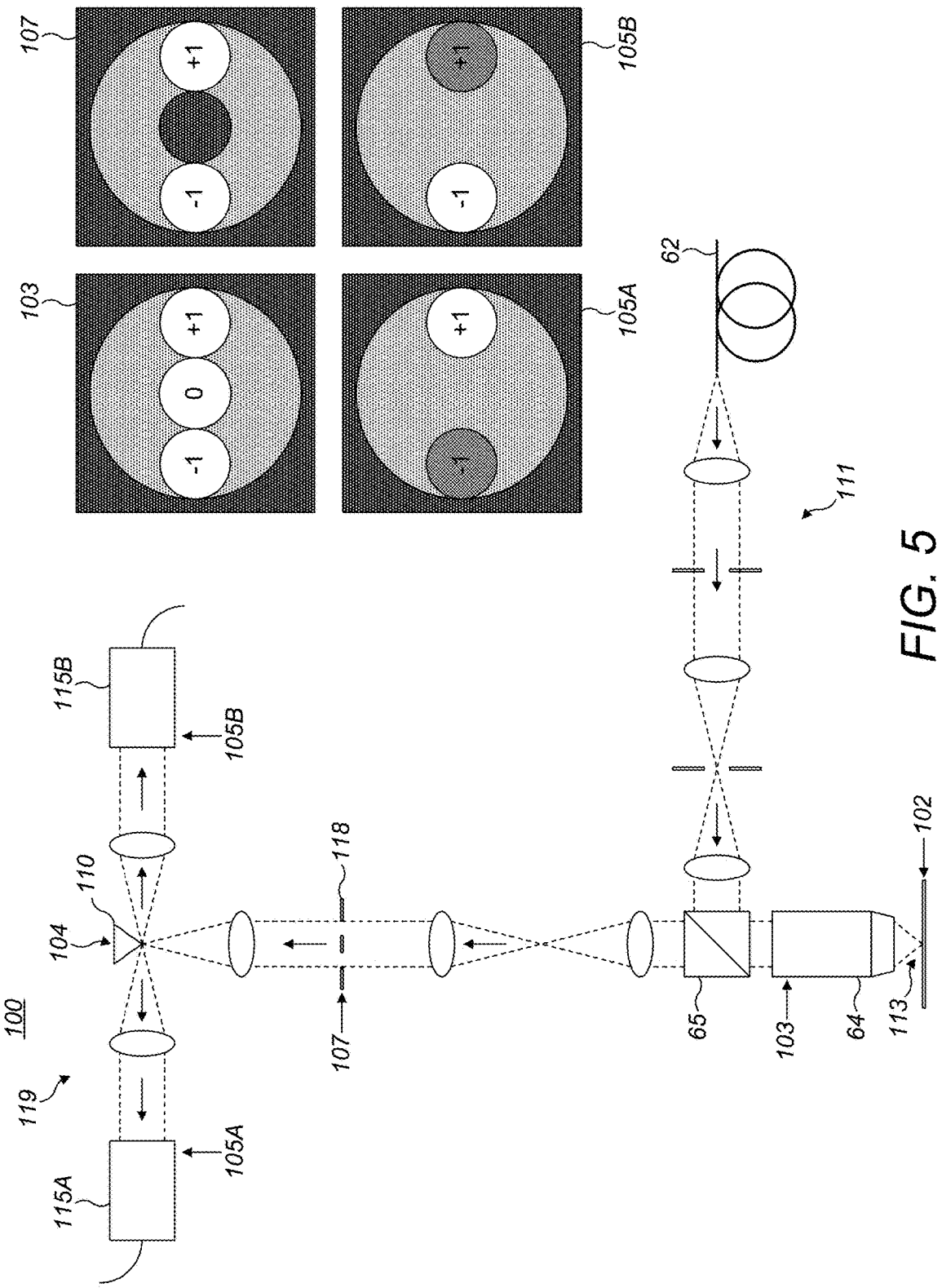

FIGS. 4 and 5 are high level schematic illustrations of pupil imaging optical systems 100, according to some embodiments of the invention. Systems 100 comprise an illumination path 111 with illumination source 62 and a collection path 119 with detectors 115A, 115B. Beam splitter 65 directs the illumination onto two SCOL targets 113 (as an illustrative, non-limiting example) and directs the reflected signals through objective 64 to collection path 119. Systems 100 comprise an optical element 110 at a field plane 104 of collection path 119 which splits the field image to yield multiple pupil images on detectors 115A, 115B. Optical element 110 is illustrated in a non-limiting manner as a prism, and may comprise any optical component which enables isolation of the pupil distributions generated by different target cells (e.g., grating(s), digital micro-mirror device(s) etc.). Optical element 110 may be configured to be reflective or refractive, depending on implementation details, as exemplified below.

The optical planes in systems 100 are illustrated as pupil plane 101 of illumination path 111 and field and pupil planes, 104 and 105 respectively, of collection path 119, defined with respect to target 113 at field plane 102 and an objective pupil 103 (shown schematically). The adjacent images illustrate the typical images at illumination pupil 101, illuminated targets 113 (at field plane 102), collected pupil 103 (zeroth and first diffraction orders), the field image segmented by optical element 110 at field plane 104 and pupil images 105A, 105B on array sensors (detectors) 115A, 115B, respectively, corresponding to the pupil images from the left target and from the right target in 102, respectively. In FIG. 5, system 100 comprises a zeroth order block 118 at a relayed pupil plane 107, which removes the zeroth order from pupil images and pupil planes 105A, 105B.

In embodiments, any of disclosed systems 100 may be configured to have any type of illumination coherence, such as incoherent illumination (e.g., illumination source 62 as an arc lamp, LDLS—laser-driven light source, speckle-busted laser), a stationary coherent spot on target (e.g., by laser) and/or a coherent spot scanned on target (e.g., by laser).

In embodiments, any of disclosed systems 100 may be configured to have any type of illumination wavelength spectrum, such as a fixed narrow spectrum, a selection from a finite number of discrete narrow spectra and/or a selection of a narrow spectrum from a source that emits a broad spectrum.

In embodiments, any of disclosed systems 100 may be configured to have any type of light distribution in illumination pupil (101) such as a fixed light distribution and/or an adjustable or programmable light distribution. In embodiments, any of disclosed systems 100 may be configured to have any type of light truncation in illumination pupil 101 such as a hard aperture truncation and/or an apodized (gradual) truncation.

In embodiments, any of disclosed systems 100 may be configured to have any type of illumination spot division in the illumination field plane, such as no division (overfill of targets), a separate illumination source (fiber) dedicated to each target, a reflective or refractive prism placed before illumination pupil 101 configured to generate separate illumination spots or patches on each target and/or a diffraction grating (beam multiplier) in illumination pupil 101 configured to generate separate illumination spots or patches on each target. It is noted that in a scanned coherent spot configuration, the scanning mechanism may be common to the spots for two or more targets.

Figure 6:
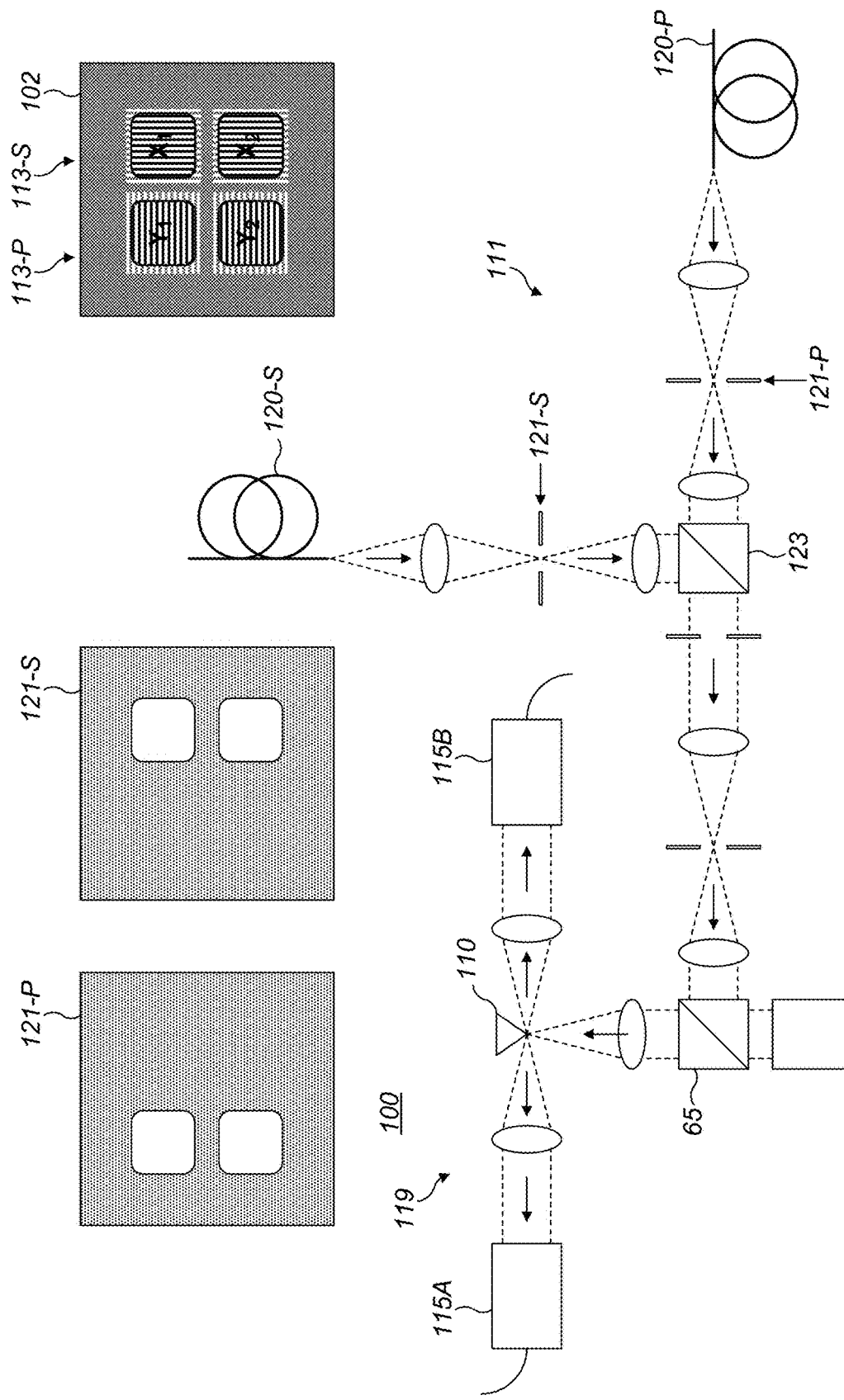
FIG. 6 is a high level schematic illustration of a pupil imaging optical system with independent polarization control of multiple target illumination, according to some embodiments of the invention.

In embodiments, any of disclosed systems 100 may be configured to have any type of illumination polarization, such as a common and fixed illumination polarization over the entire illuminated field (101), a common illumination polarization over the entire illuminated field, which is switchable between measurements, a different illumination polarization for different targets but not changeable (switchable), and/or a different and switchable illumination polarization for different targets, the latter option illustrated schematically in FIG. 6 below.

FIG. 6 is a high level schematic illustration of pupil imaging optical system 100 with independent polarization control of multiple target illumination, according to some embodiments of the invention. Illumination path 111 of system 100 may comprise S- and P-polarized illumination sources 120-S, 120-P, respectively, such as S- and P-fibers with corresponding field stops 121-S, 121-P and a polarizing beam splitter (PBS) configured to merge the S- and P-polarized illumination. As illustrated in the adjacent images, four targets (target cells) marked $X_1$, $X_2$, $Y_1$, $Y_2$ may be measured simultaneously in the illustrated configuration (polarization directions are illustrated schematically at field plane 102 by the lines over corresponding targets 113-S and 113-P). Optionally, illumination sources 120-S, 120-P may be at different wavelength ranges, illuminating targets 113 at objective field plane 102 simultaneously.

It is explicitly noted, that the terms "S-polarization" and "P-polarization" as used in this application refer to any two distinguishable modes of polarization, such as different (e.g., orthogonal) linear polarizations, a linear polarization and a circular polarization and so forth. In particular, the prefixes "S" and "P" are merely used to designate different polarization modes and are not restricted to defining linear polarization modes with respect to beam splitter axes. While the most common implementation may be linear-horizontal and linear-vertical polarizations at the wafer, actual differences in polarization states may be set in a flexible manner. For example, linear horizontal polarization may be used on one channel (e.g., "S") and circular left-hand polarization may be used on the other channel (e.g., "P"). "S" and "P" may also designate left-hand and right-hand circular polarizations, or any elliptic polarizations. Any of the polarizing beam splitters described below may be replaced with corresponding non-polarizing beam splitters and possibly additional optical elements in implementations other than two orthogonal linear polarization states.

In embodiments, any of disclosed systems 100 may be configured to have any type of illumination field stop, such as no field stop, a single aperture that overfills the target(s), multiple apertures wherein each aperture underfills an individual target (see e.g., systems 100 illustrated in FIGS. 6 and 12, and FIG. 10) and/or a programmable aperture wherein a sequential positioning of field apertures enables measuring more than four targets within a single field of view without requiring a stage (wafer) move. In embodiments, any of disclosed systems 100 may be configured to have any type of light truncation in the illumination field, such as a hard aperture truncation and/or an apodized (gradual) truncation.

In embodiments, any of disclosed systems 100 may be configured to have any type of collection pupil (103), such as a full aperture collection (typically greater than 0.90 NA), a blockage of only zeroth order reflections (118, see e.g., systems 100 illustrated in FIGS. 5, 7 and 8, and FIGS. 9 and 10) and/or a blockage of all of the pupil except for diffraction orders needed for overlay measurement.

Figure 11:
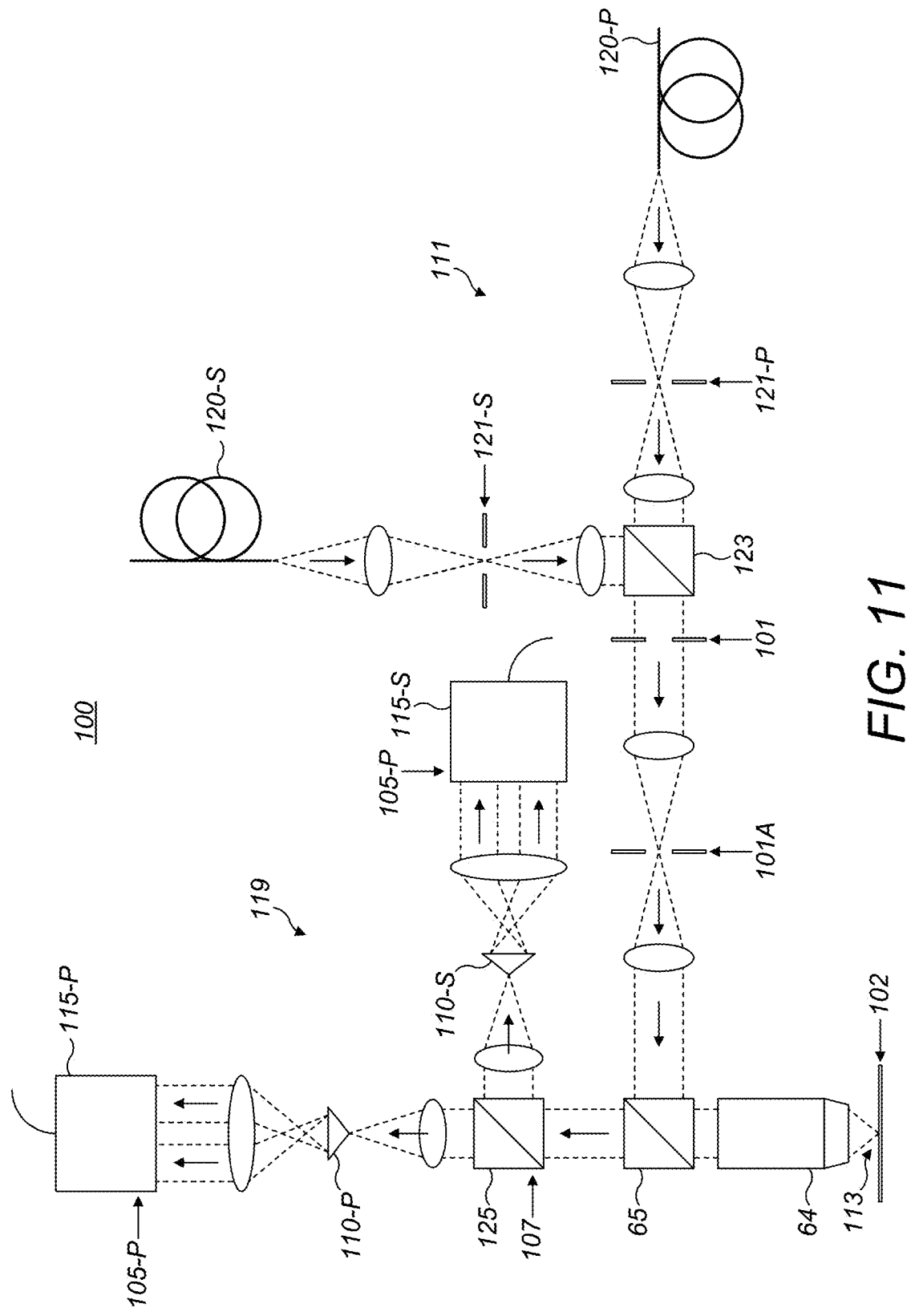
Figure 12:
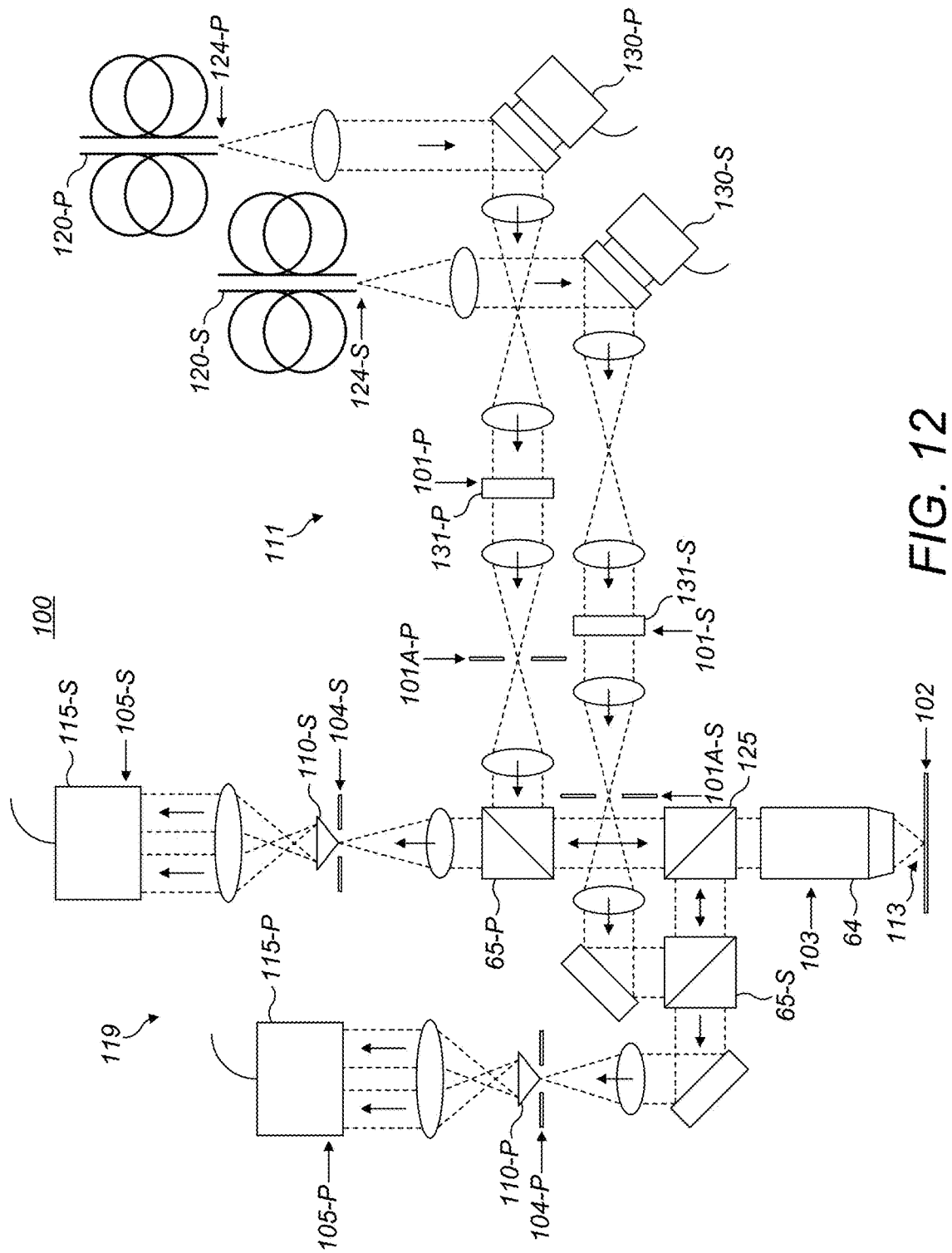
FIG. 12 is a high level schematic illustration of a system and corresponding optical path schematic images, according to some embodiments of the invention.

In embodiments, any of disclosed systems 100 may be configured to have any type of collection polarization such as no polarizing filter in collection pupil 103, a polarizing filter in collection common for all targets and/or different and selectable polarizing filter(s) for different targets (see e.g., systems 100 illustrated in FIGS. 11 and 12).

Figure 7:
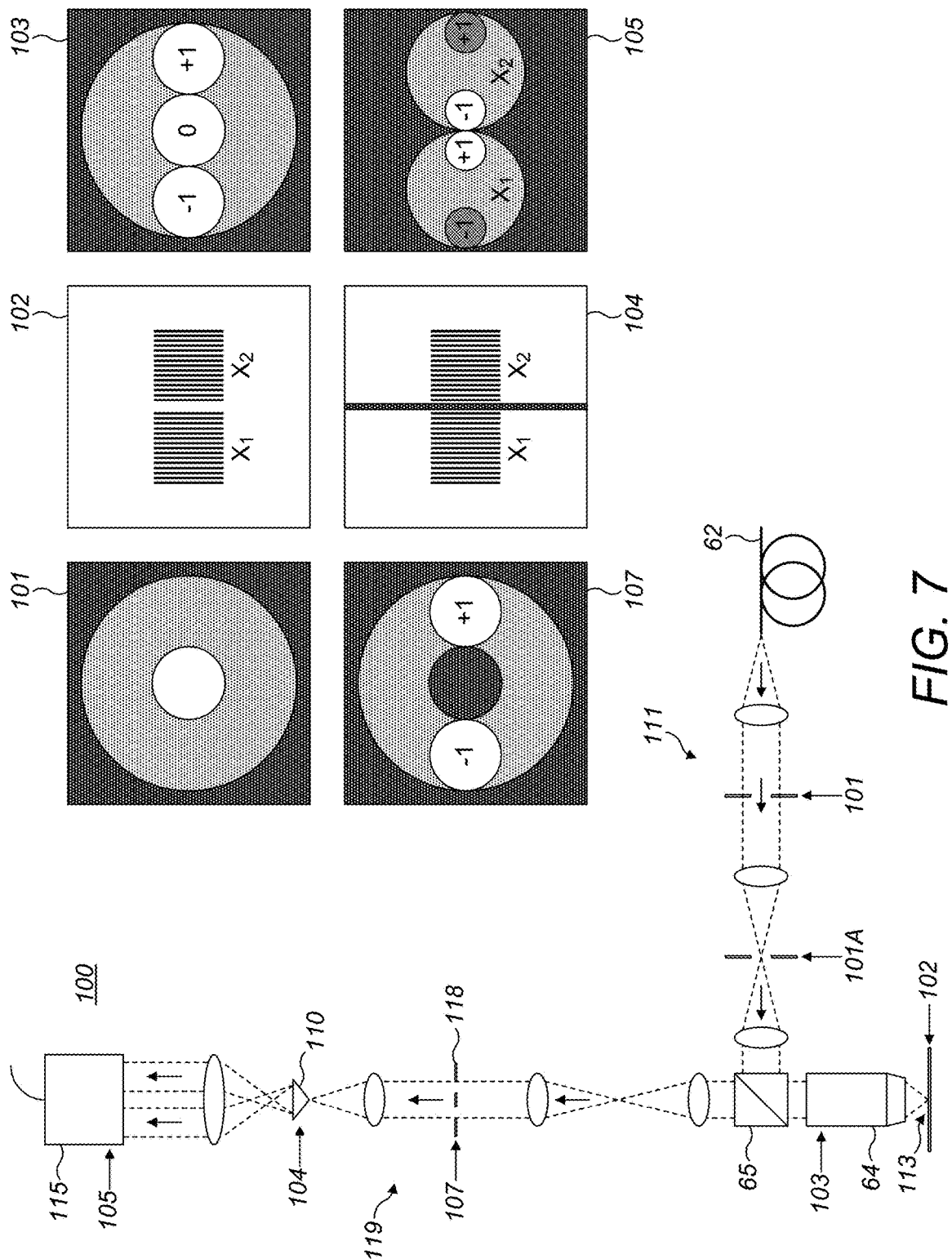
FIGS. 7-11 are high level schematic illustrations of pupil imaging optical systems with simultaneous capture of multiple targets on a single common array sensor, according to some embodiments of the invention.
Figure 8:
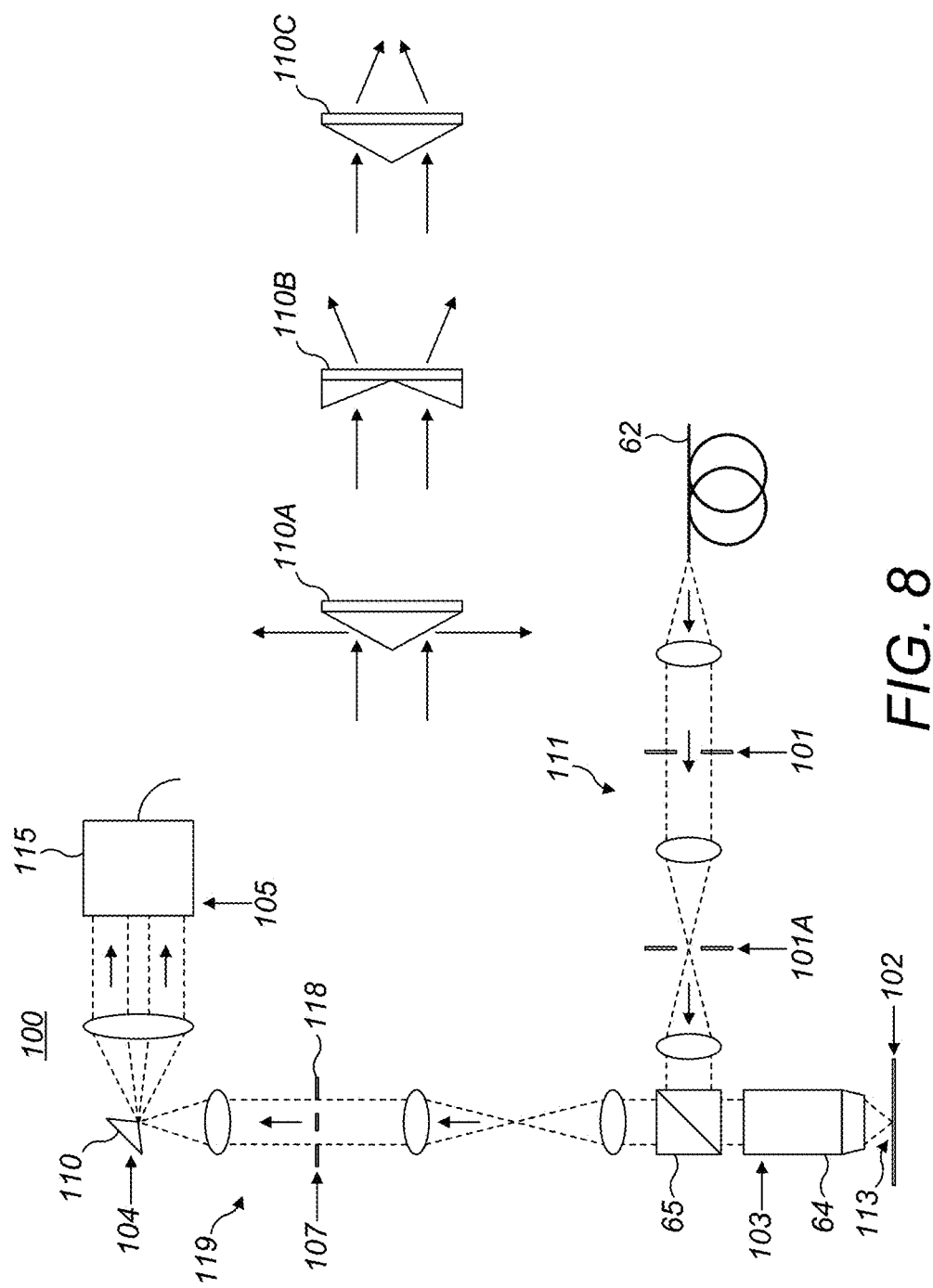

FIGS. 7-11 are high level schematic illustrations of pupil imaging optical systems 100 with simultaneous capture of multiple targets on a single common array sensor 115, according to some embodiments of the invention. In FIGS. 7 and 8, systems 100 comprise an illumination path 111 with illumination source 62 and a collection path 119 with a single detector 115. Beam splitter 65 directs the illumination onto two SCOL targets 113 (as an illustrative, non-limiting example) and directs the reflected signals through objective 64 to collection path 119. Systems 100 comprise an optical element 110 at a field plane 104 of collection path 119 which splits the field image to yield multiple pupil images on detector 115. The optical planes in systems 100 are illustrated as pupil plane 101 of illumination path 111 and field and pupil planes, 104 and 105 respectively, of collection path 119, defined with respect to target 113 at field plane 102 and an objective pupil 103 (shown schematically). In the illustrated examples, systems 100 also comprise a zeroth order block 118 at relayed pupil plane 107, which removes the zeroth order from the pupil images at pupil plane 105. In FIG. 7, the adjacent images illustrate the typical images at illumination pupil 101, illuminated targets 113 (denoted $X_1$, $X_2$ at field plane 102), collected pupil 103 (zeroth and first diffraction orders), relayed pupil plane 107 with blocked zeroth order, the field image segmented by optical element 110 at field plane 104 and pupil image 105, simultaneously comprising pupil images of both targets $X_1$, $X_2$ in 102, on array sensor (detector) 115.

Optical element 110 is configured as a refractive prism in FIG. 7 and as a reflective prism in FIG. 8 (full embodiment), with various types of prism illustrated as alternatives in FIG. 8, such as reflective prisms 110A, and diverging or converging refractive prisms 110B, 110C, respectively. It is noted that collection field 104 may be isolated to different targets or target cells by any optical device for separating the field plane image, such as refractive or reflective prisms 110 (illustrated as non-limited examples in FIGS. 7, 11-12 and FIGS. 4-6 and 8, respectively).

At field plane 104, a field stop may be lacking, or a field stop may be present with a single aperture that larger than the target(s). Alternatively of complementarily, the collection field stop may comprise multiple apertures, wherein each aperture under-samples an individual target. In some embodiments, the collection field stop may comprise single or multiple apertures which specifically block light from unwanted targets, for example S-polarized targets on a P-polarized collection channel, as illustrated below in FIG. 12 (104-S and 104-P in systems 100-X-S and 100-Y-P, respectively). Alternatively of complementarily, the collection field stop may comprise programmable apertures configured to enable sequential positioning of the apertures to measure more than four targets in a single FOV (field of view) without requiring a stage move.

Figure 9:
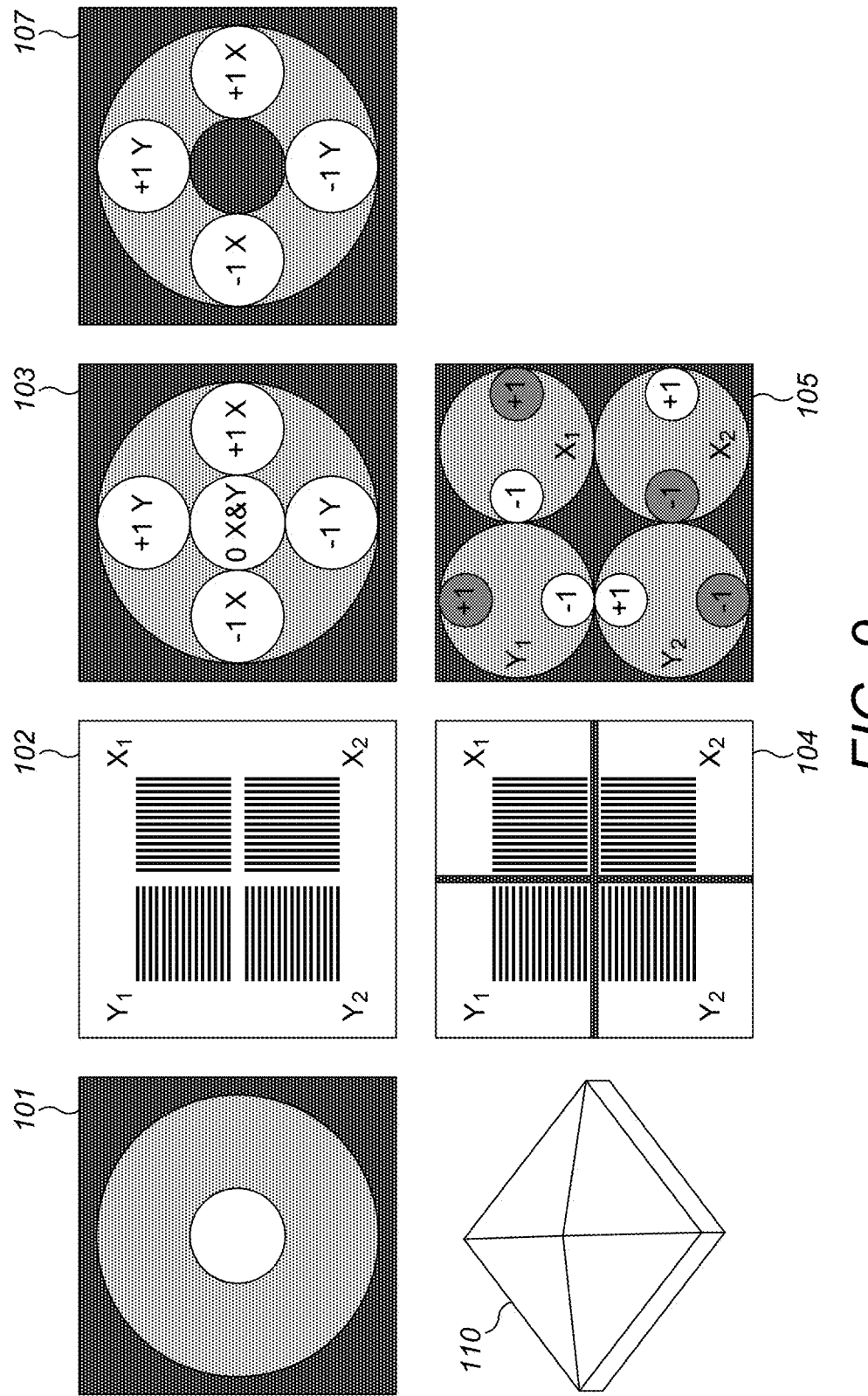

FIG. 9 illustrates schematically simultaneous capture of signals from four targets 113 on single array sensor 115 at illumination pupil 101, target plane 102 ($X_1$, $X_2$ denoting target cells with periodic structures along one direction, denoted X and $Y_1$, $Y_2$ denoting target cells with periodic structures along another direction denoted Y, which is perpendicular to X), collected pupil plane 103 (spots denoting X and Y zeroth orders and ±1 X and Y first orders), relayed pupil 107 with zeroth order blocker 118 which removes X and Y zeroth orders, and pupil plane images 105 at detector 115 which are separated into areas corresponding to the four targets ($X_1$, $X_2$, $Y_1$, $Y_2$) and their respective first order diffraction signals. The splitting is carried out at field plane 104 by optical element 110 at relayed field plane 104. In FIG. 9, the cells are spatially overfilled by illumination and collected light is limited to the interior of the cells by field stops on the collection arm that are smaller than the cells.

Figure 10:
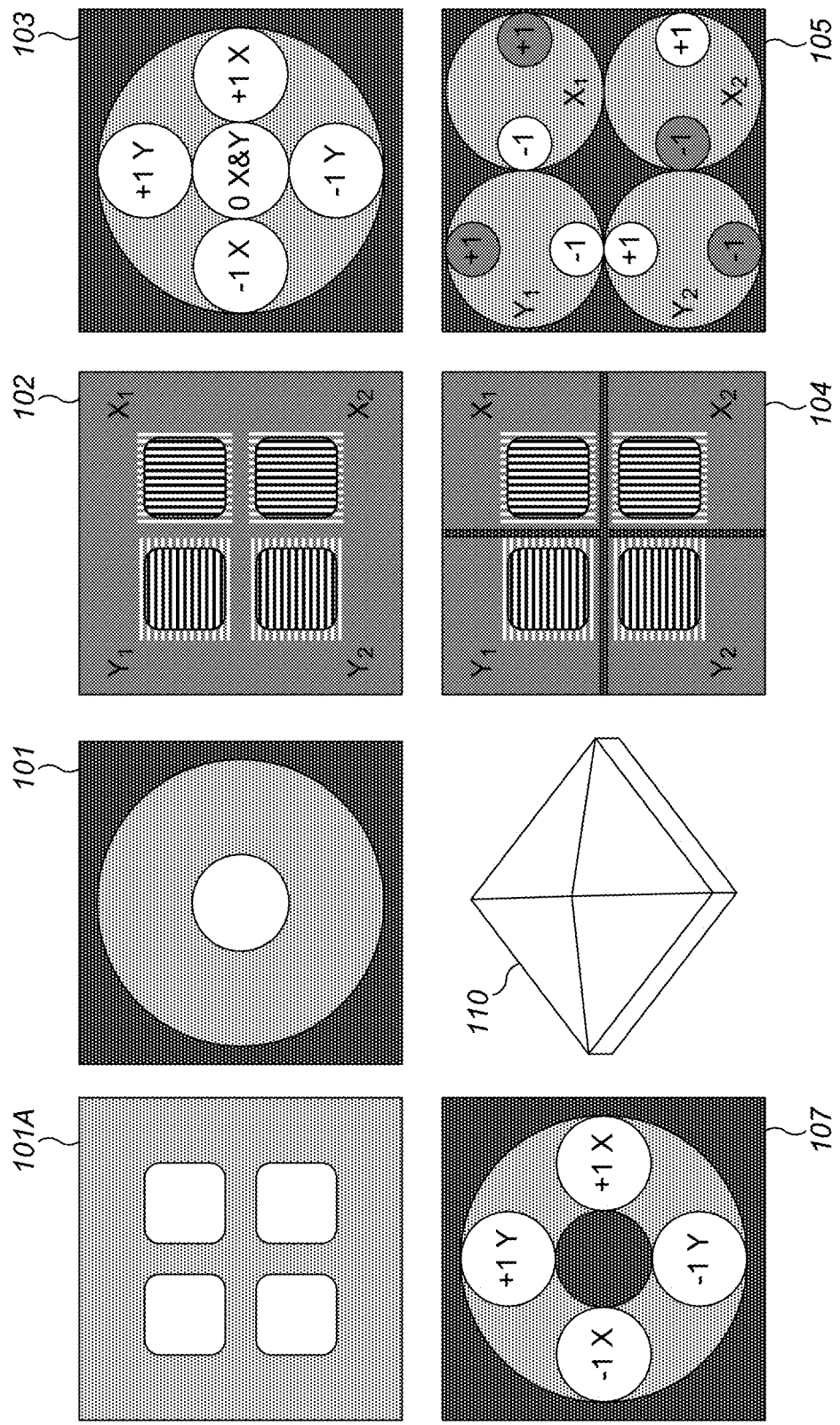

FIG. 10 illustrates schematically simultaneous capture of signals from four targets 113 on single array sensor 115, with isolated field illumination at illumination field stop 101A. In FIG. 10, the cells are spatially underfilled by illumination (either by illumination field stops that are smaller than the cells or by spot scans that are kept within the cell boundaries). The collection field stop (if any) is only used to limit stray light. It does not play a role in limiting light to within the cell boundaries.

It is noted that sensor (detector) 115 may comprise separate array sensors for each target (e.g., FIGS. 4-6) and/or a single array sensor with separated pupil images positioned on different areas of the sensor (e.g., FIGS. 7, 8, 10, 12).

In FIG. 11, target collection is additionally isolated by polarization. Starting with the design of system 100 illustrated in FIG. 7, in FIG. 11 illumination path 111 comprises S-polarized and P-polarized illumination sources, 120-S, 120-P, respectively, with corresponding field plane stops 121-S, 121-P, respectively, which are combined via a polarizing beam splitter 123 to be illuminated on target 113. At collection path 119, reflections and diffraction signals from target 113 are split at pupil plane 107 by a polarizing beam splitter 125 to be directed at detectors 115-S, 115-P, respectively, at pupil planes 105-S, 105-P, respectively, after splitting in corresponding optical elements 110-S, 110-P, respectively, e.g., as described in collection path of system 100 illustrated in FIG. 7.

FIG. 12 is a high level schematic illustration of system 100 and corresponding optical path schematic images, according to some embodiments of the invention. Based on FIG. 11, FIG. 12 further enhances the capabilities of system 100 by using multiple S- and P-polarized illumination sources 120-S, 120-P, respectively (e.g., each of which with at least one single mode fibers, two fibers are illustrated in a non-limiting manner), scanners 130-S, 130-P, respectively, (e.g., X/Y piezo scanners), pupil apodizing apertures 131-S, 131-P, respectively, at pupil planes 101-S, 101-P, respectively and corresponding (non-polarizing) beam splitters 65-S, 65-P, respectively which deliver the corresponding illumination to, and receive corresponding collection beams from polarizing beam splitter 125. The latter combines illumination from differently polarizing sources and splits reflections and diffraction signals from targets 113 via objective 64 to detectors 115-S, 115-P, respectively, back via beam splitters 65-S, 65-P, respectively, and optical elements 110-S, 110-P, respectively. Mirrors and additional optical elements may be used to optimize illumination and collection paths 111, 119, respectively.

Correspondingly, FIG. 12 further illustrates schematic images of X-targets illuminated and collected on S-polarized channels, denoted 100-X-S, Y-targets illuminated and collected on P-polarized channels, denoted 100-Y-P, as well as embodiments with both X and Y-Targets illuminated and collected on S-polarized channels, denoted 100-X,Y-S. Illumination field stops and/or single mode spot positions on S and P illumination channels may be used to define which target cells are illuminated by S or P light. Likewise field stops on the S and P collection channels may be used to define which target cells are measured with and S or P "analyzer". In this way, any permutation of illumination polarization and collection analyzer can be configured.

For 100-X-S and 100-Y-P, illumination path is illustrated by images of illumination exits 124-S and 124-P, respectively, apodized illumination apertures 101-S, 101-P, respectively, and the spots scanned within the field stop at field plane 101A-S and 101A-P, respectively, configured to result in simultaneous underfill of targets 113 on the wafer at field plane 102, indicated schematically as $X_1$, $X_2$ and $Y_1$, $Y_2$, respectively. Corresponding images of the zeroth and first diffraction orders at collection pupil 103 may be split by corresponding collection field prisms 110-S, 110-P, respectively, and delivered via collection field stops 104-S, 104-P, respectively, to yield simultaneous collection of pupil images on array sensors (detectors) 115-S, 115-P, respectively.

In 100-X,Y-S, four fiber exits are illustrated as illumination exits 124-S, providing simultaneous collection of pupil images on detector 115-S for all four target cells. Similarly, four P-polarized illumination exits may be used (not illustrated), and system 100 may be implemented with four single-mode linearly polarized fibers on both the S and P illumination channels 120-S, 120-P, respectively, to generate four S and four P spots, each aligned to one of four targets (target cells) 113. For any given target (cell) 113, either the S or the P fiber may be controlled to emit light at given time and spot scanning may be implemented to be common for all of the S spots and for all of the P spots (see scanners 130-S, 130-P, respectively). As further illustrated in FIG. 12, system 100 may comprise common a illumination aperture for the four S beams and a common illumination aperture for the four P beams, with multi-aperture illumination field stops at field planes 101A-S, 101A-P, respectively, on S and P channels with each aperture aligned to a separate target. Apertures for targets that are not illuminated may or may not be blocked. Field stops with apertures at relayed field planes 104-S, 104-P, respectively, on the S and P collection channels may be configured to block the P illuminated targets on the S collection channel and the S illuminated targets on the P collection channel (as blockers 118, not shown in FIG. 12, see FIGS. 5, 7, 8). Refractive prisms 110-S, 110-P, respectively, may be located at field planes on the S and P collection channels to separate the light from each of the targets and to position pupil images from each of the targets in quadrants of separate S and P array sensors 115-S, 115-P, respectively.

In certain embodiments, S-beams and P-beams may be configured to have different spectral wavelengths. Alternatively or complementary, orthogonal target cells (e.g., in X and Y directions) may be illuminated at different spectral wavelengths (simultaneously, in same objective field of view 102). For example, in FIG. 12, four S-polarized illumination fibers 120-S and four P-polarized illumination fibers 120-P may illuminate respective targets at different spectral wavelength, e.g., illuminate X-oriented targets and Y-oriented targets in different (possibly partially overlapping) spectral wavelength ranges. Similar spectral differentiation may be implemented e.g., in embodiments illustrated in FIGS. 6 and 11.

Figure 13:
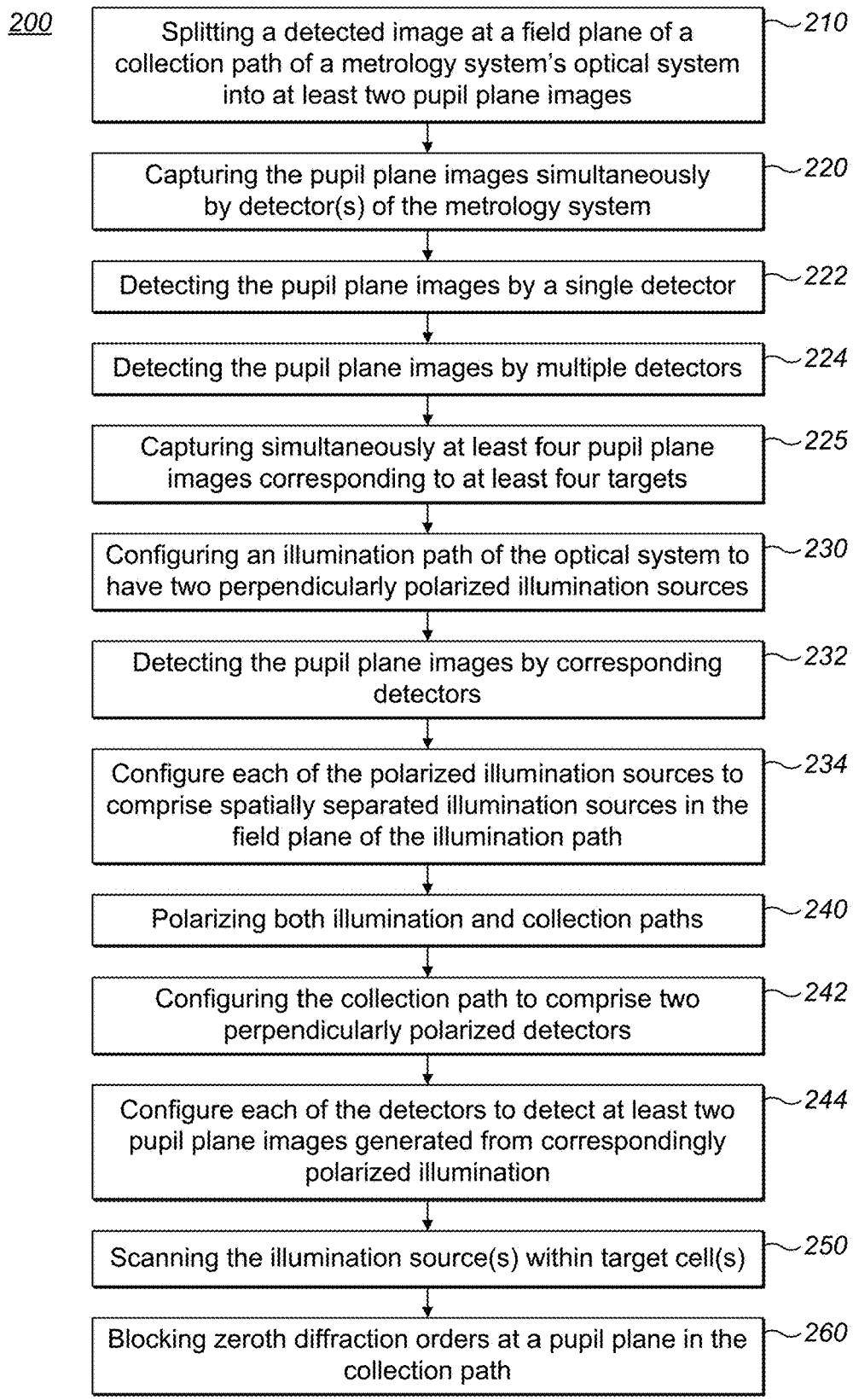
FIG. 13 is a high level flowchart illustrating a method, according to some embodiments of the invention.

FIG. 13 is a high level flowchart illustrating a method 200, according to some embodiments of the invention. The method stages may be carried out with respect to system 100 described above, which may optionally be configured to implement method 200. Method 200 comprises splitting a detected image at a field plane of a collection path of a metrology system's optical system into at least two pupil plane images (stage 210).

Method 200 may further comprise capturing the at least two pupil plane images simultaneously by at least one detector of the metrology system (stage 220). Method 200 may comprise detecting the at least two pupil plane images by a single detector (stage 222) and/or by at least two corresponding detectors (stage 224). Method 200 may comprise capturing simultaneously at least four pupil plane images corresponding to at least four targets (stage 225).

Method 200 may further comprise configuring an illumination path of the optical system to have two perpendicularly polarized illumination sources (stage 230) and further comprising detecting the at least two pupil plane images by at least two corresponding detectors (stage 232).

Method 200 may further comprise polarizing an illumination path and the collection path of the optical system (stage 240), by configuring the illumination path to comprise two perpendicularly polarized illumination sources (stage 230) and configuring the collection path to comprise two perpendicularly polarized detectors (stage 242), and further configuring each of the detectors to detect at least two pupil plane images generated from correspondingly polarized illumination (stage 244).

Method 200 may further comprise configuring each of the two perpendicularly polarized illumination sources to comprise at least two illumination sources which are spatially separated in the field plane of the illumination path (stage 234). Optionally, the at least two illumination sources may be at different wavelength ranges.

Method 200 may further comprise scanning at least one of the illumination sources within at least one target cell (stage 250).

Method 200 may further comprise blocking zeroth diffraction orders at a pupil plane in the collection path (stage 260).

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A metrology system comprising:
an optical system with an illumination path and a collection path, with at least one detector at a pupil plane of the collection path, wherein the optical system comprises at least one optical element at at least one field plane of the collection path thereof which is configured to split a detected image into at least two pupil plane images, wherein the field plane is optically conjugate in the optical system to a target on a wafer, and wherein the pupil plane is equivalent to a Fourier plane with respect to the target on the wafer.

2. The metrology system of claim 1, wherein the at least two pupil plane images are detected by a single detector of the system.

3. The metrology system of claim 1, wherein the at least two pupil plane images are detected by at least two corresponding detectors of the system.

4. The metrology system of claim 1, wherein the at least two pupil plane images comprise at least four pupil plane images corresponding to at least four targets which are captured simultaneously by the system.

5. The metrology system of claim 1, wherein the illumination path comprises two perpendicularly polarized illumination sources and the at least two pupil plane images are detected by at least two corresponding detectors of the system.

6. The metrology system of claim 1, wherein the illumination path and the collection path are polarized, the illumination path comprising two perpendicularly polarized illumination sources and the collection path comprising two perpendicularly polarized detectors, each detecting at least two pupil plane images generated from correspondingly polarized illumination.

7. The metrology system of claim 6, wherein each of the two perpendicularly polarized illumination sources comprises at least two illumination sources which are spatially separated in the field plane of the illumination path.

8. The metrology system of claim 7, wherein the at least two illumination sources are at different wavelength ranges.

9. The metrology system of claim 6, further comprising at least one scanner configured to scan at least one of the illumination sources within at least one target cell.

10. The metrology system of claim 6, further comprising apodizing apertures at the pupil plane of the illumination path.

11. The metrology system of claim 1, further comprising at least one zeroth order blocker at a pupil plane in the collection path.

12. A method comprising:
splitting a detected image at a field plane of a collection path of a metrology system's optical system into at least two pupil plane images, wherein the field plane is optically conjugate in the optical system to a target on a wafer.

13. The method of claim 12, further comprising capturing the at least two pupil plane images simultaneously by at least one detector of the metrology system.

14. The method of claim 12, further comprising detecting the at least two pupil plane images by a single detector.

15. The method of claim 12, further comprising detecting the at least two pupil plane images by at least two corresponding detectors.

16. The method of claim 12, wherein the at least two pupil plane images comprise at least four pupil plane images corresponding to at least four targets which are captured simultaneously by the metrology system.

17. The method of claim 12, further comprising configuring an illumination path of the optical system to have two perpendicularly polarized illumination sources and further comprising detecting the at least two pupil plane images by at least two corresponding detectors.

18. The method of claim 12, further comprising polarizing an illumination path and the collection path of the optical system, by configuring the illumination path to comprise two perpendicularly polarized illumination sources and configuring the collection path to comprise two perpendicularly polarized detectors, and further configuring each of the detectors to detect at least two pupil plane images generated from correspondingly polarized illumination.

19. The method of claim 18, wherein the two perpendicularly polarized illumination sources are at different wavelength ranges.

20. The method of claim 18, further comprising configuring each of the two perpendicularly polarized illumination sources to comprise at least two illumination sources which are spatially separated in the field plane of the illumination path.

21. The method of claim 18, further comprising scanning at least one of the illumination sources within at least one target cell.

22. The method of claim 12, further comprising blocking zeroth diffraction orders at a pupil plane in the collection path.

23. The method of claim 12, further comprising underfilling the target on the wafer during illumination of the target.

* * * * *